United States Patent [19]

Born et al.

[11] Patent Number: 5,776,256

[45] Date of Patent: Jul. 7, 1998

[54] COATING CHAMBER PLANETARY GEAR MIRROR ROTATING SYSTEM

[75] Inventors: Terry D. Born, Kula; Daniel O'Connell, Kihei, both of Hi.

[73] Assignee: The United States of America as represented by the Secretary of the Air Force, Washington, D.C.

[21] Appl. No.: 725,226

[22] Filed: Oct. 1, 1996

[51] Int. Cl.⁶ .................................................. C23C 16/00
[52] U.S. Cl. .............. 118/730; 118/500; 204/298.27; 204/298.28
[58] Field of Search ................. 118/719, 730, 118/500, 729, 50; 204/298.27, 298.28

[56] References Cited

U.S. PATENT DOCUMENTS

| | | | |
|---|---|---|---|
| 3,633,537 | 1/1972 | Howe | 118/725 |
| 3,783,822 | 1/1974 | Wollam | 118/725 |
| 3,853,091 | 12/1974 | Christensen et al. | 118/720 |
| 4,851,095 | 7/1989 | Scobey et al. | 204/192 |
| 4,860,689 | 8/1989 | Frijlink | 118/500 |
| 4,951,604 | 8/1990 | Temple et al. | 118/723 EB |
| 4,996,798 | 3/1991 | Moore | 51/161 |
| 5,002,011 | 3/1991 | Ohmine et al. | 118/725 |
| 5,124,013 | 6/1992 | Seddon et al. | 204/192 |
| 5,151,133 | 9/1992 | Ohmine et al. | 118/725 |
| 5,468,299 | 11/1995 | Tsai | 118/730 |
| 5,558,721 | 9/1996 | Kohmura et al. | 118/730 |

FOREIGN PATENT DOCUMENTS

| | | | |
|---|---|---|---|
| 62-85423 | 4/1987 | Japan | 118/730 |
| 64-28371 | 1/1989 | Japan | 118/730 |
| 61-290711 | 12/1996 | Japan | 118/730 |
| 2168080 | 6/1986 | United Kingdom | 118/730 |

*Primary Examiner*—R. Bruce Breneman
*Assistant Examiner*—Jeffrie R. Lund
*Attorney, Agent, or Firm*—Stanton E. Collier

[57] ABSTRACT

A optical surface is mounted on a mirror rotating system having a carousel therein having gears which rotates said optical surface in a circular path while the optical surface itself rotates about an axis. The radius between the mirror support and the planetary gear is adjustable. The system is mounted on support legs within the vacuum chamber so that the optical surface can face downward when the apparatus is placed in a bell jar (or any such environment which provides a vacuum). A source of vaporized substance is placed under the apparatus, so that the optical surface, facing downward, is facing said source. This arrangement allows for an improvement in the uniformity of the substance deposited on the optical surface.

5 Claims, 1 Drawing Sheet

COATING CHAMBER PLANETARY GEAR MIRROR ROTATING SYSTEM

STATEMENT OF GOVERNMENT INTEREST

The invention described herein may be manufactured and used by or for the Government for governmental purposes without the payment of any royalty thereon.

BACKGROUND OF THE INVENTION

The present invention relates to coating optical surfaces, and, in particular, relates to improving the coating uniformity of a given substance on optical surfaces.

A conventional process of coating mirrors involves vaporizing a material in a vacuum chamber. The vaporized material would then adhere to the mirror surface. Neither the mirror nor the means to vaporize have any movement therein to assist in creating a more uniform deposition.

U.S. Pat. No. 4,851,095 discloses a process of attaching the objects to be coated to a cylindrical moving surface which moves by a plurality of devices for creating material to be deposited. Also shown therein is an in-line translational system where many objects are placed on a conveyor belt and exposed to magnetron sputtering sources.

U.S. Pat. No. 5,124,013 discloses a coating apparatus having a planetary system of gears to move a substrate to be coated about a major axis wherein different materials are provided and a minor axis wherein the substrate is moved. The above patents are incorporated by reference.

Although the above attempt to provide a uniform coating to surfaces, it is believed that there is no apparatus capable of depositing a substance on an optical surface as uniformly and as evenly as the present invention. Thus, there exists a need for the development of the present invention, which is able to deposit a more uniform coating distribution on an optical surface.

SUMMARY OF THE INVENTION

The present invention comprises a mirror rotating system for use in a vacuum coating chamber. This apparatus operates in vacuum so as to facilitate the deposit of the desired substance on said optical surface. The mirror rotating system has uniquely mounted gears and shafts to move the optical surface in a complex pattern. The invention has a motor to drive this system. As a substance is released in vacuum, the optical surface is rotated in a circular motion while the optical surface itself is rotating about an axis through its own center. This motion of the optical surface results in an even coating of the substance being deposited on said optical surface. Orbit to rotation ratios can be varied by making simple adjustments on the device of the present invention.

Therefore, one object of the present invention is to provide an even coating of a chosen substance on an optical surface.

Another object of the present invention is to provide a means for rotating a chosen object (in this case, an optical surface) in a motion in which the object itself rotates about an axis through said object while said object itself is being rotated around a circular path.

These and many other objects and advantages of the present invention will be readily apparent to one skilled in the pertinent art from the following detailed description of a preferred embodiment of the invention and the related drawings.

DESCRIPTION OF THE PREFERRED EMBODIMENT

Figure 1:
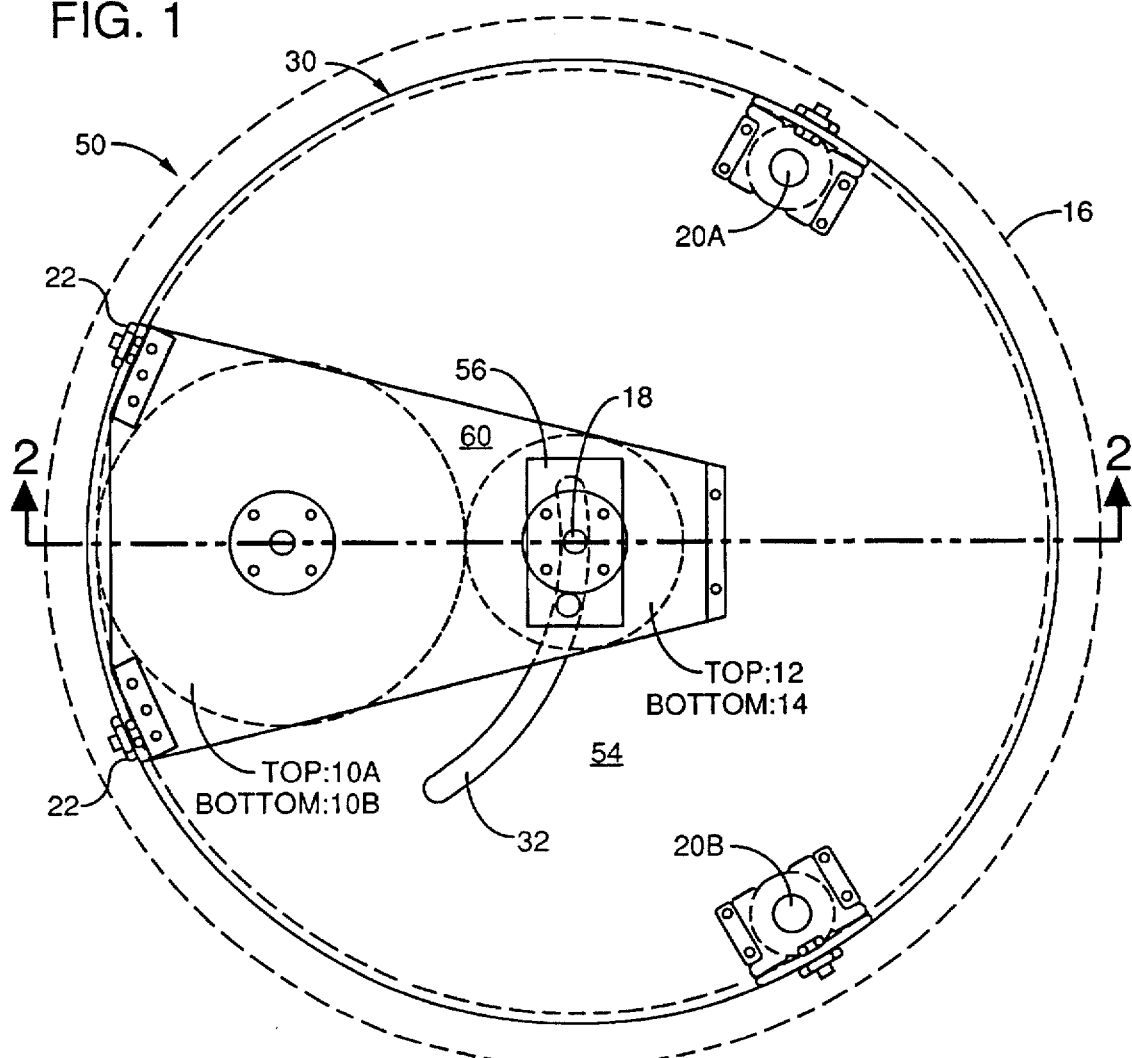
FIG. 1 illustrates by a top view the mirror rotating system from a plane parallel to the plane in which the optical surface is placed.

Referring to FIG. 1, a mirror rotating system 50 is shown. Conventional features of the coating apparatus such as the sputtering source, vacuum chamber, vacuum pumps, electrical power, etc. are shown either schematically or not at all.

This system 50 includes a carousel 30 having an upper and lower floor 60 and 54, respectively, which has mounted thereon a planetary rotation gear 10, an input drive gear 12, an output drive gear 14 mounted under the input drive gear 12, an internal ring gear 16 which is stationary within the vacuum chamber, two idler gears 20A and 20B, and two support bearing trucks 22. FIG. 1 also depicts the axis placement groove 32 which allows for the desired placement of gear 14.

Figure 2:
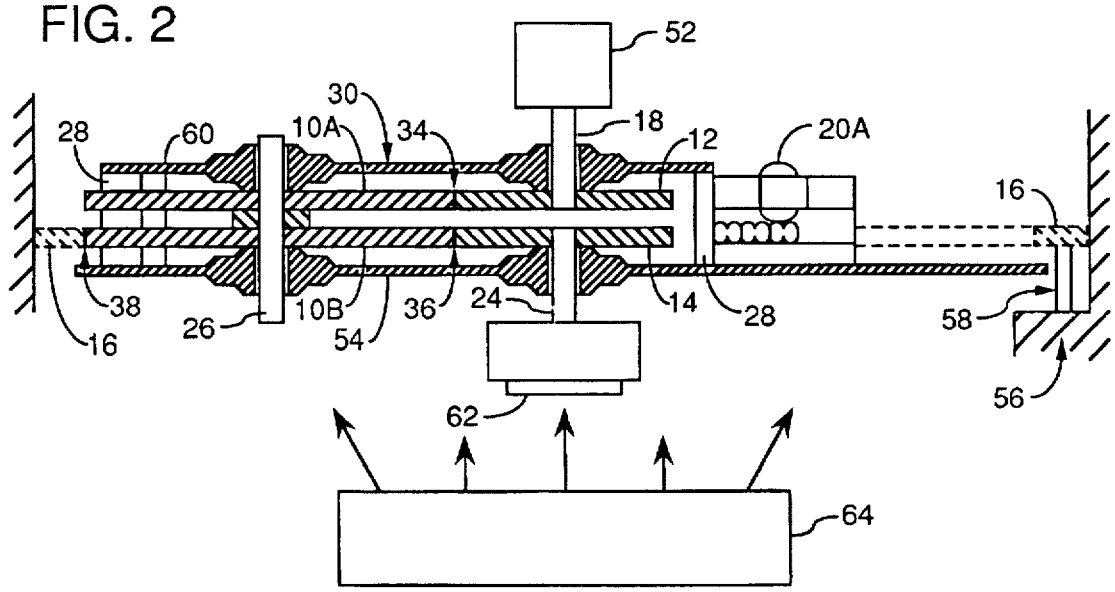
FIG. 2 illustrates by a cross-sectional view of the mirror rotating system of FIG. 1.

Referring to FIG. 2, the system of gears is partially shown. This system includes the upper and lower planetary drive gears 10A and 10B mounted on a common shaft 26, the input drive gear 12, the output drive gear 14, the internal ring gear 16, the input shaft 18, the output shaft and mirror support 24, the gear shaft 26, housing supports 28, and the carousel 30. Arrows are used to pinpoint the gear meshing connections between the input drive gear and the upper planetary drive gear 34, the lower planetary drive gear and the output drive gear 36, and the internal ring gear and the lower planetary gear 38.

The mirror rotating system operates when a motor 52, FIG. 2, drives the input shaft 18. The shaft 18 is mounted in the upper floor 60 within a carousel housing 30. The rotation of this shaft 18 rotates the input drive gear 12 which in turn rotates the upper planetary drive gear 10A. The upper planetary drive gear 10A is connected by a common gear shaft 26 to the lower planetary drive gear 10B, so the lower planetary drive gear 10B rotates as well. The rotation of the lower planetary drive gear 10B rotates both the carousel 30 and the output drive gear 14. An optical surface 62 is supported on the output shaft 24 in a conventional manner. Referring to FIG. 1, the output gear 14, being under input gear 12, can be adjustably rotated about the planetary gear 10 along the axis placement groove 32 to change the radius of orbit about the input shaft 18. The groove 32 is placed in a lower floor 54 of the carousel 30. A bracket 56 having a bearing therein for the output shaft 24 is movable along the groove 32 by means of holddown bolts therethrough, not shown.

The idler gears 20A and 20B, mounted on the lower floor 54, are used to hold the lower planetary gear 10B into mesh with the internal ring gear 16 which is mounted to the vacuum chamber 57, only partially shown, by three legs 58, only one shown, attached to the under side of the internal ring gear 16. These supports 58 allow the optical surface 62 to be supported over a vaporizing source 64 and be orbited about it for a uniform coating. The input shaft 18 is driven by a variable speed DC gear motor through a vacuum feed through a port at the top of a bell jar. Orbit to rotation ratios can be varied by changing the gear ratio between input gear 12 and planetary gears 10A.

Clearly many modifications and variations of the present invention are possible in light of the above teachings and it is therefore understood, that within the inventive scope of the inventive concept, that the invention may be practiced otherwise than specifically claimed.

What is claimed is:

1. A mirror rotating system, said mirror rotating system mounted within a vacuum chamber having a source of coating material therein, said mirror rotating system moving a mirror in a complex pattern to provide for a more uniform coating on the surface of said mirror, said mirror rotating system comprising:

a carousel, said carousel having means for holding the mirror, wherein said carousel comprises:
a carousel housing, said carousel housing comprising an upper floor; and
a lower floor;
at least two idler gears, said idler gears mounted to said lower floor and engaged with an internal ring gear;
at least two bearing trucks, said bearing trucks being mounted to said upper floor of said carousel and riding on a top surface of said internal ring gear;
means for rotating said carousel within said internal ring gear; and
means for rotating a mirror holder, said means for rotating a mirror holder mounted on said carousel and engaged with said means for rotating said carousel, said means for rotating a mirror holder being adjustable to change a radius of movement; and means for holding said carousel within the vacuum chamber, said means for holding allowing said carousel to rotate within said vacuum chamber, said rotation further causing the mirror mounted to said carousel to rotate.

2. A mirror rotating system as defined in claim 1 wherein said means for holding comprises:

a plurality of support legs;

an internal ring gear, said internal ring gear having said plurality of support legs attached thereon, said support legs being positionable within the vacuum chamber.

3. A mirror rotating system as defined in claim 1 wherein said means for rotating said carousel within said internal ring gear comprises:

an electric motor, said electric motor being adjustable in speed;

an input shaft, said electric motor attached to said input shaft, said input shaft rotatably mounted within said upper floor;

an input drive gear, said input drive gear mounted to said input shaft under said upper floor;

a planetary gear shaft, said gear shaft rotatably mounted within said upper floor and said lower floor;

an upper planetary gear, said upper planetary gear being mounted on said gear shaft, said upper planetary gear being changeable; and a lower planetary gear, said lower planetary gear being mounted on said gear shaft under said upper planetary gear, said lower planetary gear being engaged to said internal ring gear whereby said motor is able to cause said carousel to rotate within said internal ring gear.

4. A mirror rotating system as defined in claim 3 wherein said means for rotating a mirror holder comprises:

an output shaft, said output shaft being mounted in said lower floor, said output shaft being adjustably mounted in said lower floor within an axis placement groove;

an output gear, said output gear being mounted to said output shaft and engaged with said lower planetary gear, said output gear being mounted above said lower floor;

a mirror holding device, said mirror holding device being mounted onto said output shaft under said lower floor.

5. A mirror rotating system as defined in claim 4 wherein said mirror holding device holds said mirror upside down.

* * * * *